United States Patent
Barna (10) Patent No.: US 9,608,151 B2
(45) Date of Patent: Mar. 28, 2017

(54) SOLAR SHIELD

(71) Applicant: Kyle Steven Barna, Syracuse, NY (US)

(72) Inventor: Kyle Steven Barna, Syracuse, NY (US)

(73) Assignee: Cooper Technologies Company, Houston, TX (US)

(*) Notice: Subject to any disclaimer, the term of this patent is extended or adjusted under 35 U.S.C. 154(b) by 337 days.

(21) Appl. No.: 13/692,205

(22) Filed: Dec. 3, 2012

(65) Prior Publication Data

US 2014/0150841 A1    Jun. 5, 2014

(51) Int. Cl.
| | | |
|---|---|---|
| *H01L 31/02* | (2006.01) | |
| *H01L 31/048* | (2014.01) | |
| *F24J 2/46* | (2006.01) | |

(52) U.S. Cl.
CPC .......... *H01L 31/048* (2013.01); *F24J 2/4607* (2013.01); *H01L 31/02008* (2013.01); *Y02E 10/50* (2013.01)

(58) Field of Classification Search
CPC ...... H01L 31/045; F24J 2/4609; F24J 2/4607; B42F 9/001–9/005; A47H 2015/005; F21V 1/14; F21V 1/143; F21V 1/146; F21V 1/04; F21V 1/06; F21V 1/08; E06B 3/302; E06B 3/303; E06B 3/305; E06B 3/306; E06B 5/025; E06B 5/10; E06B 5/103; E06B 2009/005; E06B 2009/2476; E06B 2009/2423; E06B 2009/2429; E06B 2009/2435; E06B 2009/2441
See application file for complete search history.

(56) References Cited

U.S. PATENT DOCUMENTS

| | | | | |
|---|---|---|---|---|
| 2,951,163 | A | * | 8/1960 | Shaffer et al. ......... 250/214 SG |
| 3,283,804 | A | * | 11/1966 | Yancey ..................... E06B 3/28 160/106 |
| 4,233,790 | A | * | 11/1980 | Meadows ............... E06B 3/285 160/395 |
| 4,282,919 | A | * | 8/1981 | Teno ................... E06B 9/17015 160/23.1 |
| 4,321,419 | A | | 3/1982 | Hanafin |
| 5,170,539 | A | * | 12/1992 | Lundstedt ............ A44B 11/006 24/194 |
| 5,522,943 | A | * | 6/1996 | Spencer et al. ............... 136/245 |

(Continued)

FOREIGN PATENT DOCUMENTS

| | | |
|---|---|---|
| CN | 201051501 | 4/2008 |
| DE | 102008022128 | 11/2009 |

(Continued)

OTHER PUBLICATIONS

Machine translation of DE102008022128A1.*
Machine translation of H08-316509A.*

*Primary Examiner* — Eric R Smith
(74) *Attorney, Agent, or Firm* — King & Spalding LLP (57) ABSTRACT

A solar shield can include a body and at least one fastening feature. The body can have a length and a width, where each of the length and the width is at least large enough to cover a top surface of at least one of a number of PV solar panels. The at least one fastening feature can be mechanically coupled to the body. The at least one fastening feature, when enabled, secures the body to the top surface of the at least one of the plurality of PV solar panels. The body can be rigid or flexible. The at least one fastening feature can be, at least, a clip, a clamp, or a strap.

17 Claims, 7 Drawing Sheets

(56) References Cited

U.S. PATENT DOCUMENTS

| | | | |
|---|---|---|---|
| 5,555,683 A | | 9/1996 | Schroeder |
| 5,566,609 A | * | 10/1996 | Kirschner ............. B62B 3/1428 108/42 |
| D390,160 S | * | 2/1998 | Milligan ...................... D11/216 |
| 5,873,504 A | * | 2/1999 | Farmer ......................... 224/576 |
| 5,905,356 A | * | 5/1999 | Wells ............................ 320/101 |
| 6,294,724 B1 | * | 9/2001 | Sasaoka et al. .............. 136/251 |
| 6,911,593 B2 | | 6/2005 | Mazumder et al. |
| 6,977,479 B2 | * | 12/2005 | Hsu ............... 320/101 |
| 2003/0094921 A1 | * | 5/2003 | Lau et al. .................... 320/101 |
| 2003/0155762 A1 | * | 8/2003 | Gaska .................... B42F 9/005 281/45 |
| 2005/0092356 A1 | * | 5/2005 | Sakai ........................... 136/251 |
| 2005/0161079 A1 | * | 7/2005 | Gray ................... H04B 1/3883 136/251 |
| 2007/0151594 A1 | * | 7/2007 | Mascolo et al. ............. 136/245 |
| 2009/0000221 A1 | | 1/2009 | Jacobs et al. |
| 2010/0096000 A1 | * | 4/2010 | Andrade ................ F21S 9/037 136/246 |
| 2010/0229916 A1 | | 9/2010 | Bechamp |
| 2011/0041888 A1 | | 2/2011 | Levine |
| 2011/0047891 A1 | * | 3/2011 | Andretich .............. F24J 2/5264 52/79.5 |
| 2011/0310539 A1 | | 12/2011 | Dai |
| 2012/0174961 A1 | * | 7/2012 | Larson ............. H01L 31/02021 136/246 |

FOREIGN PATENT DOCUMENTS

| | | |
|---|---|---|
| FR | 2501839 | 9/1982 |
| JP | 08316509 A * | 11/1996 |

\* cited by examiner

SOLAR SHIELD

TECHNICAL FIELD

The present disclosure relates generally to solar shields and more particularly to systems, methods, and devices for protecting a photovoltaic (PV) solar panel and/or preventing ultraviolet light from reaching the cells within the PV solar panel.

BACKGROUND

PV solar panels use photovoltaic technology to generate electricity from ultraviolet light and other sources of solar radiation. Generally, PV solar cells do not have an on/off switch. In other words, if the PV solar panel (or, more specifically, the grouping of solar cells within the PV solar panel) is exposed to ultraviolet light or other sources of solar radiation, the PV solar panel generates electricity. This can create a hazard when maintenance is being performed on certain parts of a PV solar system. Particularly, an electrical hazard can be created when maintenance is being performed on a PV solar system and such maintenance involves working with electrical components of the PV solar system.

SUMMARY

In general, in one aspect, the disclosure relates to a solar shield. The solar shield can include a body having a length and a width, where each of the length and the width is at least large enough to cover a top surface of at least one of a number of PV solar panels. The solar shield can also include at least one fastening feature mechanically coupled to the body, where the at least one fastening feature, when engaged, secures the body to the top surface of the at least one of the PV solar panels.

These and other aspects, objects, features, and embodiments will be apparent from the following description and the appended claims.

BRIEF DESCRIPTION OF THE DRAWINGS

The drawings illustrate only exemplary embodiments and are therefore not to be considered limiting in scope, as the exemplary embodiments may admit to other equally effective embodiments. The elements and features shown in the drawings are not necessarily to scale, emphasis instead being placed upon clearly illustrating the principles of the exemplary embodiments. Additionally, certain dimensions or positionings may be exaggerated to help visually convey such principles. In the drawings, reference numerals designate like or corresponding, but not necessarily identical, elements.

DETAILED DESCRIPTION

Exemplary embodiments of solar shields will now be described in detail with reference to the accompanying figures. Like, but not necessarily the same or identical, elements in the various figures are denoted by like reference numerals for consistency. In the following detailed description of the exemplary embodiments, numerous specific details are set forth in order to provide a more thorough understanding of the disclosure herein. However, it will be apparent to one of ordinary skill in the art that the exemplary embodiments herein may be practiced without these specific details. In other instances, well-known features have not been described in detail to avoid unnecessarily complicating the description. Further, certain descriptions (e.g., top, bottom, side, end, interior, inside, inner, outer) are merely intended to help clarify aspects and are not meant to limit embodiments described herein.

In general, exemplary embodiments provide systems, methods, and devices for solar shields. Specifically, exemplary embodiments provide for covering one or more PV solar panels and preventing (or greatly reducing the amount of) solar radiation from passing therethrough. As a result, the solar cells within the PV solar panel do not receive the solar radiation, and so cannot generate electricity while the solar shield is engaged.

The exemplary solar shields described herein can be opaque, translucent, or have any of a number of other characteristics, as long as the exemplary solar shield prevents all or substantially all solar radiation from passing therethrough. Any solar radiation that passes through the solar shield is not enough to allow the solar cells of the PV solar panel to generate electricity. The exemplary solar shields described herein can be of any thickness, length, and or width. The solar shields can be rigid, flexible, foldable, slidable, expandable, collapsible, have some other characteristic, or have any combination thereof.

A user may be any person that interacts with a PV solar panel and/or equipment associated with a PV solar system. Examples of a user may include, but are not limited to, an engineer, an electrician, an instrumentation and controls technician, a mechanic, an operator, a consultant, a contractor, and a manufacturer's representative.

FIGS. 1A-1D illustrate various applications for which PV solar panels can be used. Consequently, the exemplary applications shown in FIGS. 1A-D for which PV solar panels can be used are a few of the many applications for which the exemplary solar shield can be used to cover one or more PV solar panels. In one or more embodiments, one or more of the components shown in FIGS. 1A-1D may be omitted, repeated, and/or substituted. Accordingly, embodiments of applications for which PV solar panels can be used should not be considered limited to the specific arrangements of components shown in FIGS. 1A-1D.

Figure 1A:
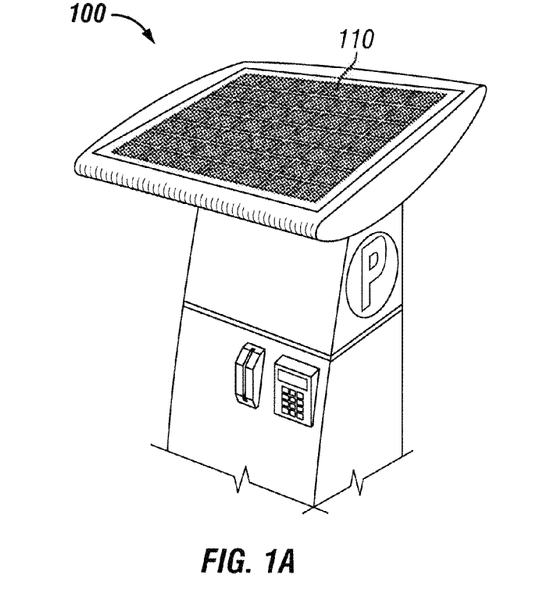
FIGS. 1A-1D show various applications for which PV solar panels can be used.
Figure 1B:
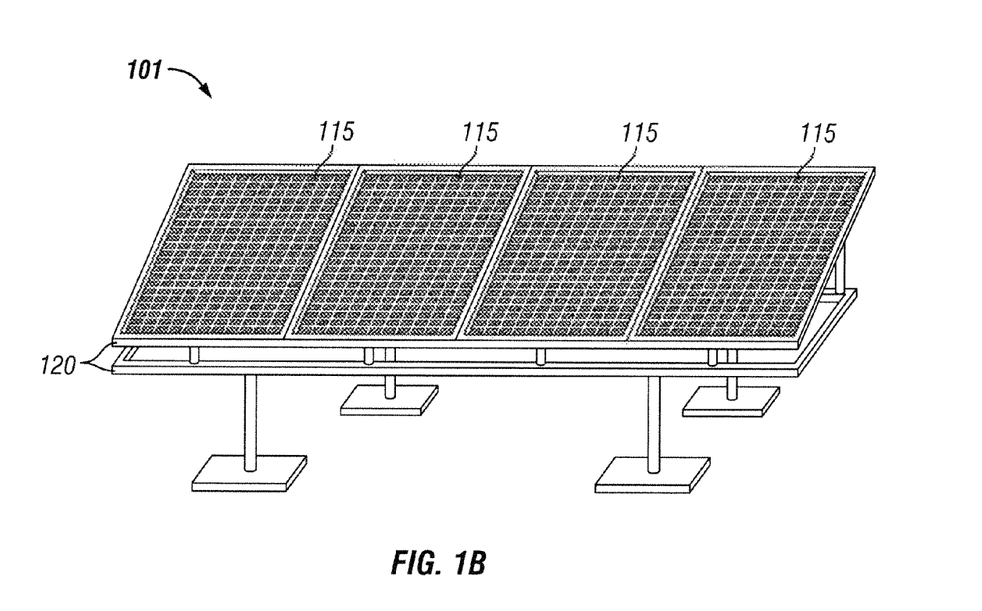
Figure 1C:
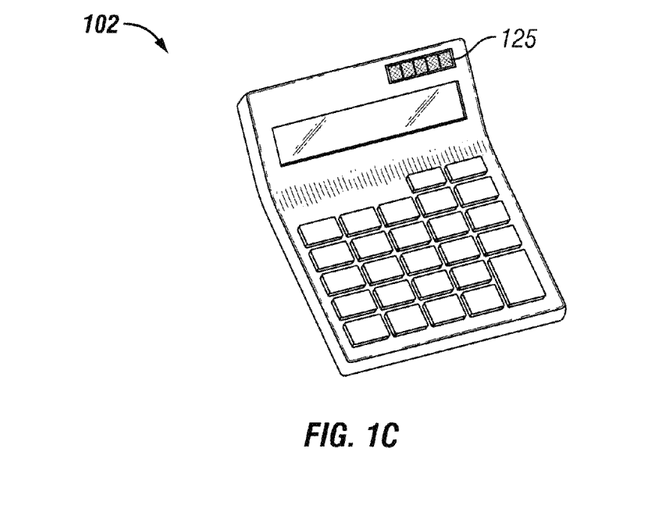
Figure 1D:
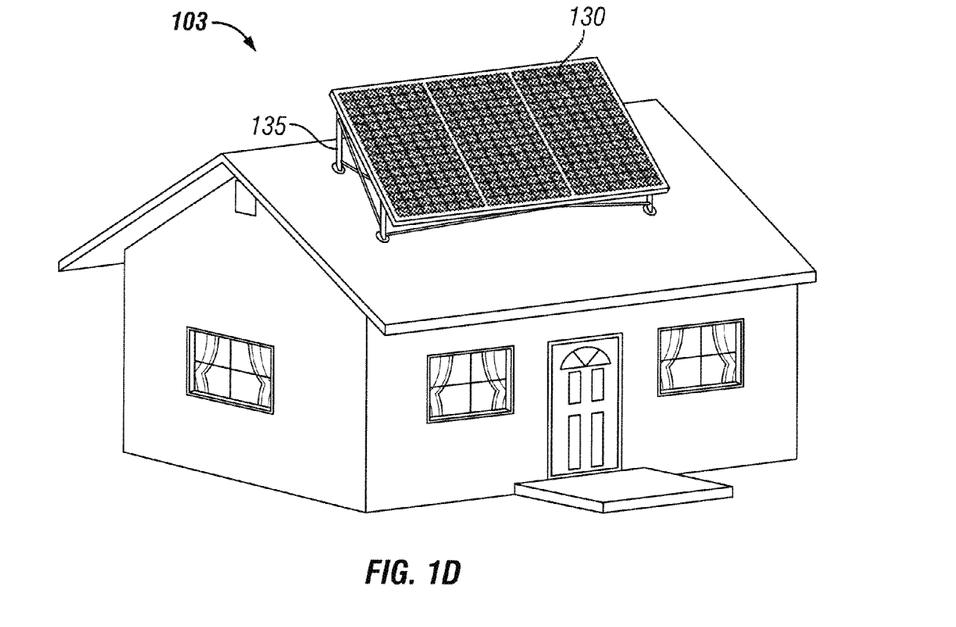

Referring to FIGS. 1A-1D, one or more PV solar panels 110 can be used with a parking meter 100, as shown in FIG. 1A. FIG. 1B shows a ground-mounted PV solar array system 101 with a number of PV solar panels 115 mounted on a rack 120. FIG. 1C shows a calculator 102 that is powered by electricity generated by a built-in PV solar panel 125. Finally, FIG. 1D shows a roof-mounted PV solar array system 103 with a number of PV solar panels 130 mounted on a rack 135. Each of the PV solar panels shown in FIGS. 1A-D can be the same or a different size (e.g., width, height, depth), have the same and/or different generating capability, and/or have other characteristics that are the same and/or different from each other.

Figure 2A:
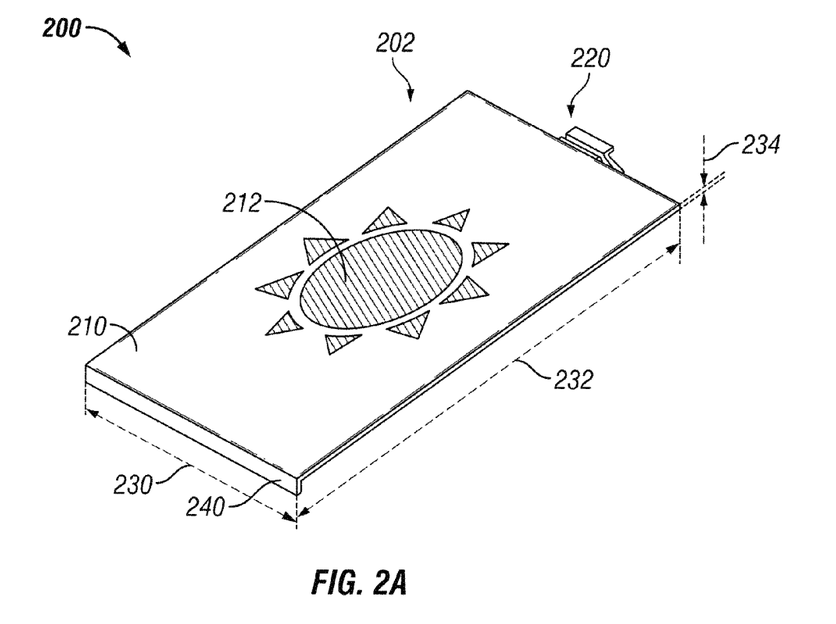
FIGS. 2A and 2B each shows various views of an exemplary solar shield in accordance with certain exemplary embodiments.
Figure 2B:
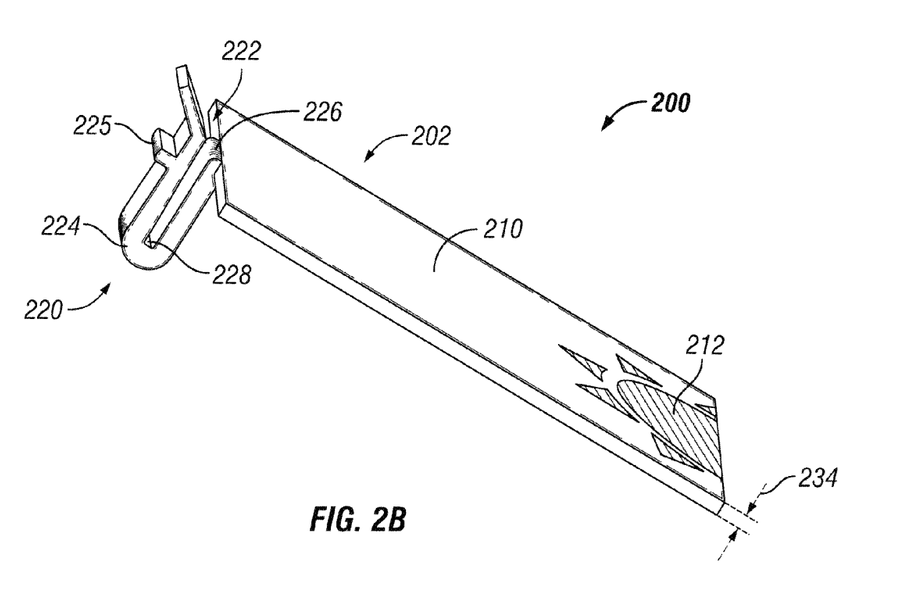

FIGS. 2A and 2B show various views of an exemplary solar shield 200 in accordance with certain exemplary embodiments. In one or more embodiments, one or more of the components shown in FIGS. 2A and 2B can be omitted, repeated, and/or substituted. Accordingly, embodiments of solar shields should not be considered limited to the specific arrangements of components shown in FIGS. 2A and 2B.

Referring now to FIGS. 2A and 2B, the exemplary solar shield 200 includes a body 202 that, in this case, is a flat surface having a length 232, a width 230, and a height 234 (also called a thickness). In this case, the body 202 (or portion thereof, such as the frame of the body 202) of the solar shield 200 is made of a rigid material, and so the length 232, the width 230, and the height 234 of the body 202 do not change when the solar shield 200 moves or changes position. The body 202 in this example is substantially rectangular, so that the height 234 and width 230 substantially correlate to a height and width of one or more PV solar panels (not shown) that the solar shield 200 can be used to cover. The body 202 of the solar shield 200 can have, or can be shaped to fit over, any of a number of shapes, including but not limited to square, circular, oval, and irregular. Some or all of the body 202 can be made from one or more of a number of materials, including but not limited to stainless steel, aluminum, plastic, wood, rubber, cloth, and nylon.

The body 202 of the solar shield 200 has a top or front surface 210. Disposed on the top surface 210 of the body 202 is a graphic 212. The graphic 212 can be a symbol, a logo, a series of alpha-numeric characters (e.g., words, text), a picture, some other feature, or any combination thereof. The graphic 212 can be one or more of a number of colors. The graphic 212 can be painted, etched, stitched, disposed on the top surface 210 in some other way, or any combination thereof. In addition, or in the alternative, the graphic 212 can be disposed on one or more other surfaces (e.g., back surface, side surface) of the body 202 of the solar shield 200.

The solar shield 200 also includes a fastening feature 220. The fastening feature 220 in this example is a clip. The clip in this case includes a base 226 that is fixedly coupled to a side (in this case, the top side) surface of the body 202. In addition, or in the alternative, the base 226 of the fastening feature 220 can be coupled to a different portion (e.g., the top surface 210, the back surface) of the body 202. The fastening feature 220 can be part of the body 202 (as from a mold) or can be mechanically coupled to the body 202.

If the fastening feature 220 is coupled to the body 202, the fastening feature 220 can be coupled to the body 202 in one or more of a number of ways, including but not limited to welding, fastening devices (e.g., screws, bolts), epoxy, compression fittings, mating threads, slots, and snap fittings. Further, the fastening feature 220 can be coupled to the body 202 in one or more of a number of ways, including but not limited to fixedly, hingedly, slidably, rotatably, and removably. The fastening feature 220 can be made from the same and/or a different material than the material of the body 202. Examples of a material from which the fastening feature 220 can be made can include, but are not limited to, stainless steel, aluminum, plastic, nylon, and rubber.

Figure 4A:
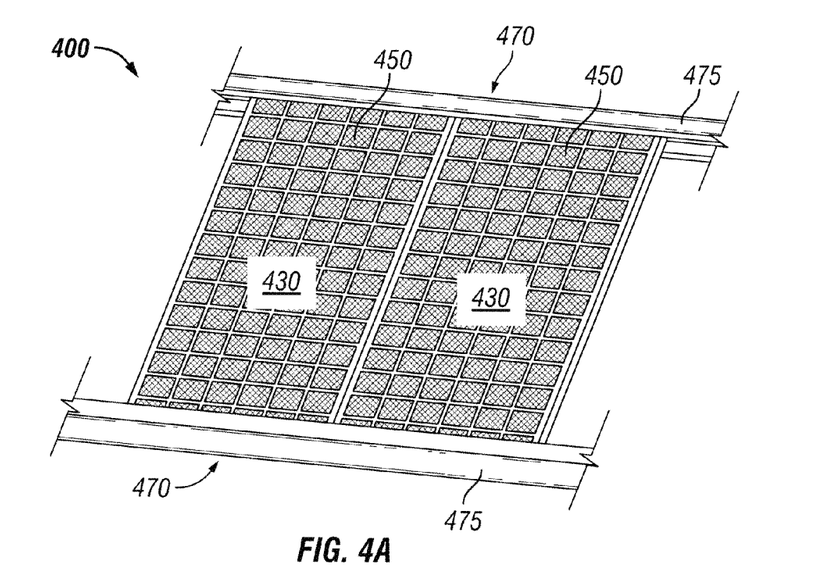
FIGS. 4A-C show various views of the exemplary solar shield of FIGS. 2A and 2B covering a PV solar panel in accordance with certain exemplary embodiments.
Figure 4B:
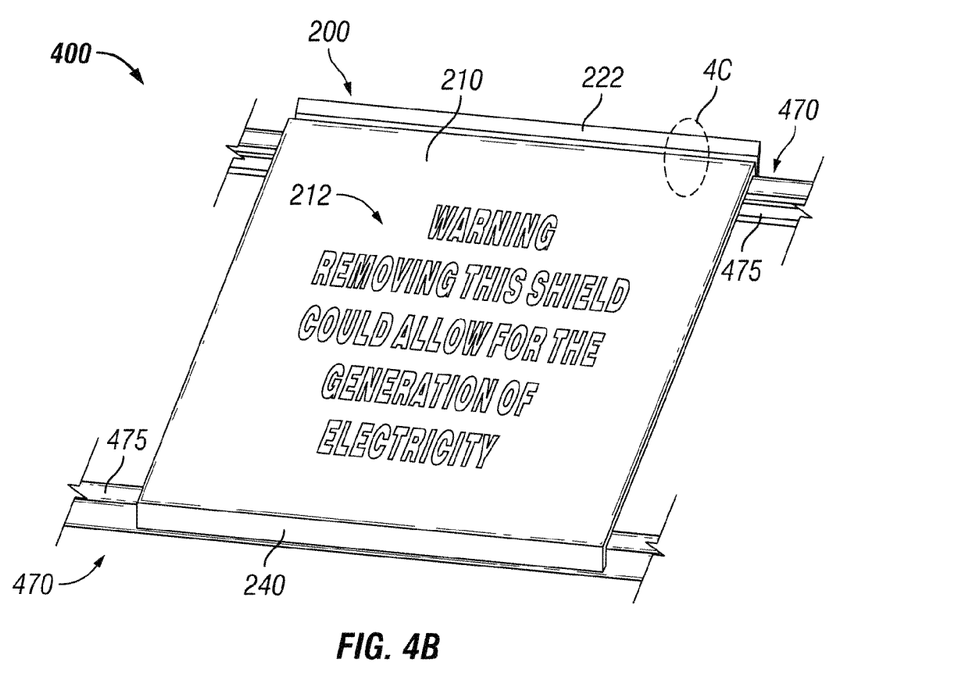
Figure 4C:
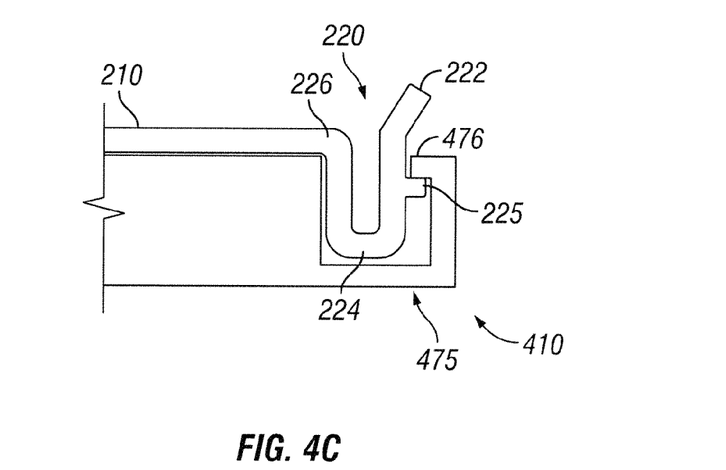

In addition to the base 226, the fastening feature 220 of FIGS. 2A and 2B includes a body 224 and a neck 222. As shown in FIGS. 4A-4C below, the body 224 can be inserted into a portion (e.g., a frame) of a PV solar system. In such a case, the solar shield 200 can be secured over the top surface of one or more PV solar panels using the body 224 of the fastening feature 220. The body 224 can have one or more of a number of features to mechanically couple with some other feature (e.g., a frame of a PV solar system, a portion of a PV solar panel), thereby allowing the solar shield 200 to be secured over a top surface of one or more PV solar panels. In this example, the body 224 of the fastening feature 220 is folded over on itself at approximately 180°, so that portions of the body 224 run parallel to each other and have a gap 228 therebetween. The gap 228 allows the neck 222 to be pinched inward toward the base 226 a slight distance, which can allow the fastening feature 220 to be inserted into and/or removed from a corresponding feature of another component of the solar shield 200 and/or the PV solar system. For example, as shown in FIGS. 4A and 4B, the corresponding feature can be a channel in a U-bracket, where the U-bracket is part of the frame of a PV solar system.

The neck 222 can have one or more of a number of features, including the tab 225 shown in FIG. 2B. The tab 225 can be any type of protrusion used to secure the fastening feature 220 to a component of the PV solar system. The tab 225 can have one or more of a number of shapes and/or dimensions. Further, the tab 225 can protrude from the neck 222 at any angle. In addition, or in the alternative, the tab 225 can act as a stop, preventing the fastening feature 220 from traveling beyond a certain point in a certain direction when mechanically coupled to another feature of the solar shield 200 and/or a component of the PV solar system.

Optionally, the solar shield 200 can include a protrusion 240 that extends substantially perpendicular to the top surface 210 in an inward direction (i.e., extending away from the top surface 210). In such a case, the protrusion 240 can be used to help secure the solar shield 200 to the top surface of the one or more PV solar panels. Specifically, when the solar shield 200 covers the top surface of a PV solar panel, the protrusion 240 can contact an edge of the PV solar panel and/or some other component of the PV solar system. The protrusion 240 can be located on one or more side surfaces of the body 202. Such side surfaces can be the same side surfaces and/or different side surfaces to which the fastening feature 220 is coupled. The protrusion 240 can be flat and/or have one or more of a number of features (e.g., gripping surface, uneven surface, detents, additional protrusions, clips) that can be used to help secure the solar shield 200 to the top surface of one or more PV solar panels.

Figure 3:
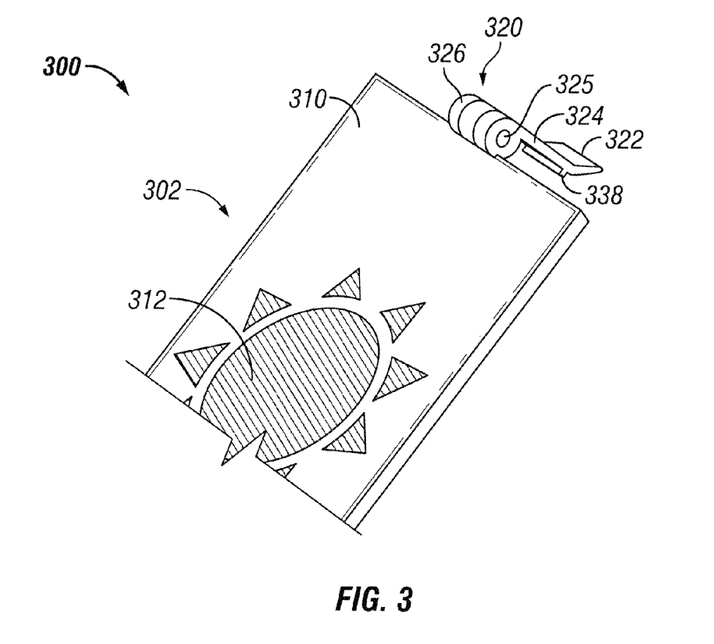
FIG. 3 shows various views of the exemplary solar shield of FIGS. 2A and 2B covering a PV solar panel in accordance with certain exemplary embodiments.

FIG. 3 shows an alternative solar shield 300 in accordance with certain exemplary embodiments. In this case, the body 302 of the solar shield 300 is substantially the same as the body 202 of the solar shield 200 of FIGS. 2A and 2B. The fastening feature 320 of the solar shield 300 of FIG. 3 is a clip. However, the fastening feature 320 in FIG. 3 differs from the fastening feature 220 of FIGS. 2A and 2B.

For example, the fastening feature 320 is hingedly coupled to the side surface of the top side of the body 302. Specifically, the base 326 of the fastening feature 320 is hingedly coupled to the top side surface of the body 302. As such, the fastening feature 320 can rotate axially around the hinge 325 of the base 326 between a closed (engaged) position and an open (disengaged) position. A closed position of the fastening feature 320 is a position in which the fastening feature 320 can become engaged with a component of a PV solar system, thereby allowing the solar shield 300 to cover a top surface of one or more PV solar panels. An open position is when the fastening feature 320 is not in the closed position. The fastening feature 320 can have an open position and a closed position when the fastening feature 320 is not fixedly coupled to the body 302 of the solar shield 300.

A body 324 of the fastening feature 320 couples the base 326 to the neck 322. In this case, the body 324 is substantially flat (is not folded over itself as in FIGS. 2A and 2B) and straight. The neck 322 has a shelf 338 that protrudes substantially perpendicular to the body 324 in an inward direction. The shelf 338, when the fastening feature 320 is moved into a closed position (i.e., when the body 324 is substantially perpendicular to the top surface 310 of the solar shield 300), is positioned behind a component of the PV solar system (e.g., a back surface of a PV solar panel). In such a case, the solar shield 300 can be secured over a top surface of one or more PV solar panels. Further, when the fastening feature 320 is in the closed position, the inner surface of the body 324 of the fastening feature 320 can make contact with a component of the PV solar system, thereby further securing the solar shield 300 when the solar shield 300 covers the top surface of one or more PV solar panels.

FIGS. 4A-4C show various views of system 400 that includes the exemplary solar shield 200 of FIGS. 2A and 2B covering a couple of PV solar panels 450 in accordance with certain exemplary embodiments. Except as described below, the components of the solar shield 200 are substantially similar to the corresponding components described above with respect to FIGS. 2A-3.

Referring to FIGS. 1A-4C, FIG. 4A shows a front view of a PV solar system 400 with two PV solar panels 450 mounted on a mounting rack 470 that includes two laterally extending U-brackets 475. FIG. 4B shows the PV solar system 400 where an exemplary solar shield 200 is placed over the top surface 430 of the PV solar panel 450. FIG. 4C shows a detailed cross sectional side view of a mounting rack 470 to which the solar shield 200 couples when solar shield 200 covers the top surface 430 of the PV solar panel 450. In one or more embodiments, one or more of the components shown in FIGS. 4A-4C can be omitted, repeated, and/or substituted. Accordingly, embodiments of solar shields should not be considered limited to the specific arrangements of components shown in FIGS. 4A-4C.

FIG. 4A shows a PV solar panel 450 mounted on a mounting rack 470 that is substantially similar to the mounting rack 120 shown in FIG. 1B and/or the mounting rack 135 shown in FIG. 1D above. As detailed in FIG. 4C, the mounting rack 470 includes a U-bracket 475 that has a width and depth that substantially corresponds to the width and depth of the body 224 of the fastening feature 220. In such a case, the body 224 of the fastening feature 220, using the tab 225, can lock into place within the channel of the U-bracket 475 when the tab 225 is positioned below the inwardly extending portion 476 of the U-bracket 475.

The top surface 210 of the solar shield 200 in this case includes a graphic 212. Specifically, the graphic 212 disposed on the top surface 210 of the solar shield 200 includes a warning, stating that removing the solar shield could cause the generation of electricity by the PV solar panel 450. Such a graphic 212 could be used to alert a user of the potential danger in removing the solar shield 200 if, for example, maintenance on the PV solar system is being performed.

In addition, the solar shield 200 in FIGS. 4B and C includes a protrusion 240 that extends substantially perpendicular to the top surface 210 in an inward direction (i.e., extending away from the top surface 210). In this case, the protrusion 240 is located on a bottom side surface, opposite the top side surface on which the fastening feature 220 is coupled. The protrusion 240 helps secure the solar shield 200 to the top surface 430 of the PV solar panel 450. Specifically, when the solar shield 200 covers the top surface 430 of a PV solar panel 450 as shown in FIG. 4B, the protrusion 240 contacts the bottom edge of the PV solar panel 450. The protrusion 240 in this case is flat and straight. The PV solar panel 450 can be a single PV solar panel or a number of PV solar panels that are coupled to the mounting rack 470.

Figure 5:
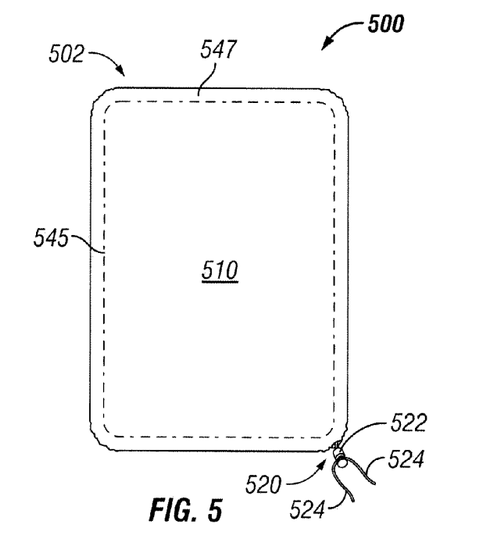
FIG. 5 shows another exemplary solar shield in accordance with certain exemplary embodiments.

FIG. 5 shows a front view of another exemplary solar shield 500 in accordance with certain exemplary embodiments. In this case, the body 502 of the solar shield 500 is made, at least in part, of one or more non-rigid (flexible) materials. Such flexible material can include, but is not limited to, elastic, nylon, vinyl, plastic, rubber, polyester fabric, and cotton fabric. Specifically, at least the outer portions 547 of the body 502 of the solar shield 500 are made of flexible material. The outer portion 547 is the area between the outer perimeter of the body 502 and stitching 545 that is disposed substantially parallel to the outer perimeter at some distance inward from the outer perimeter.

The outer portion 547 includes a channel that passes through the top surface 510 and is bounded by the stitching 545. For example, the top surface 510 can be folded over on itself on the bottom surface (not shown), and the stitching 545 can be made along the outer edge of the top surface 510 to create the channel in the outer portion 547. In certain exemplary embodiments, through this channel passes a flexible securing member 524 of a fastening feature 520, which protrudes through one or more openings in the channel. Examples of a securing member 524 in this case can include, but are not limited to, a string, a rope, a cable tie, a tube, and a gasket. In this example, the securing member 524 is a rope. The securing member 524 can optionally be collected and secured using a securing member 522 of the fastening feature 520. Alternatively, the securing member 524 can be tied along its ends.

As a specific example, the top surface 510 of the solar shield 500 can have a length and/or width that is larger than the length and/or width of the PV solar panel 450 that the solar shield 500 is covering. In such a case, the excess portions 547 of the solar shield 500 can be wrapped around the back surface of the PV solar panel 450 and secured by pulling on one (engaging) or more ends of the securing member 524 and subsequently engaging the securing device 522 to lock the securing member 524 in place. To release the solar shield 500 from the top surface 430 of the PV solar panel 450, the securing device 522 is disengaged, which releases the securing member 524 and allows the excess portions 547 of the body 502 of the solar shield 500 to become slack. In such a case, the solar shield 500 can be removed, exposing the top surface 430 of the PV solar panel 450 to solar radiation.

Figure 6:
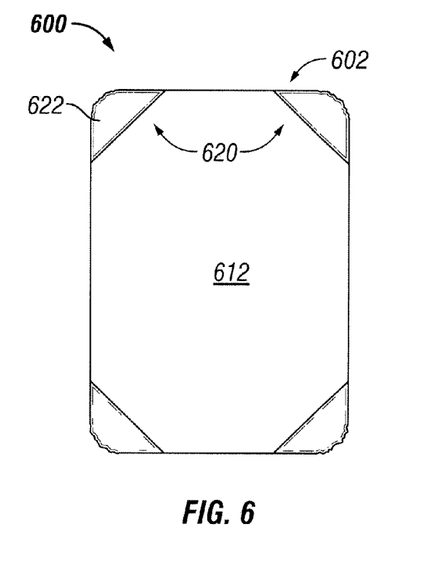
FIG. 6 shows yet another exemplary solar shield in accordance with certain exemplary embodiments.

FIG. 6 shows another exemplary solar shield 600 in accordance with certain exemplary embodiments. Specifically, FIG. 6 shows the back surface 612 of the body 602 of the solar shield 600. In this example, the bottom or back surface 612 includes a fastening feature 620 that includes one or more pockets 622 that are fixedly coupled (e.g., sewed, affixed with epoxy) to some portion (e.g., an outer surface or side) of the body 602. Each pocket 622 can fit over (engage) a corner or edge piece of a component (e.g., a PV solar panel 450) of a PV solar system 444. The pocket 622 can be made of one or more of a number of flexible or non-rigid materials (e.g., nylon, cotton fabric) to engage the corner or edge piece of a component (e.g., a PV solar panel 450) of the PV solar system 444 so that the solar shield 600 covers the top surface 430 of one or more PV solar panels 450.

To remove the solar shield 600 from the top surface 430 of the PV solar panel 450, the one or more pockets 622 are disengaged by sliding the pocket 622 over the corner or edge piece of the component of the PV solar system 444 that is contained by the pocket 622. When this occurs, so that none of the pockets 622 are engaged with a corner or edge piece of the component of the PV solar system 444 that is contained by the pocket 622, the solar shield 600 can be removed, exposing the top surface 430 of the PV solar panel 450 to solar radiation.

Figure 7:
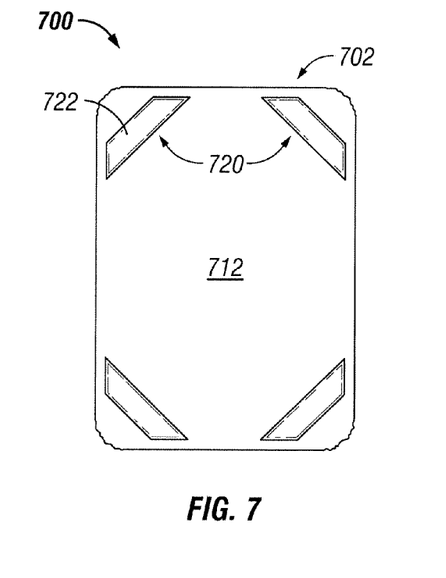
FIG. 7 shows still another exemplary solar shield in accordance with certain exemplary embodiments.

FIG. 7 shows yet another exemplary solar shield 700 in accordance with certain exemplary embodiments. Specifically, FIG. 7 shows the back surface 712 of the body 702 of the solar shield 700. In this example, the bottom or back surface 712 includes a fastening feature 720. The fastening feature 720 in this case can include one or more securing bands 722 that are fixedly coupled (e.g., sewed, affixed with epoxy), in one or more locations (e.g., at each end of the securing band 722) to some portion (e.g., part of the back surface 712, on one or more sides) of the body 702. Each securing band 722 can fit over (engage) a corner or edge piece of a component (e.g., a PV solar panel 450) of a PV solar system 444. The securing band 722 can be made of one or more of a number of flexible or non-rigid materials (e.g., elastic, nylon, cotton fabric) to engage the corner or edge piece of a component (e.g., a PV solar panel 450) of the PV solar system 444 so that the solar shield 700 covers the top surface 430 of one or more PV solar panels 450.

To remove the solar shield 700 from the top surface 430 of the PV solar panel 450, the one or more securing bands 722 are disengaged by sliding the securing band 722 over the corner or edge piece of the component of the PV solar system 444 that is contained by the securing band 722. When this occurs, so that none of the securing bands 722 are engaged with corner or edge piece of the component of the PV solar system 444 that is contained by the securing band 722, the solar shield 700 can be removed, exposing the top surface 430 of the PV solar panel 450 to solar radiation.

Figure 8:
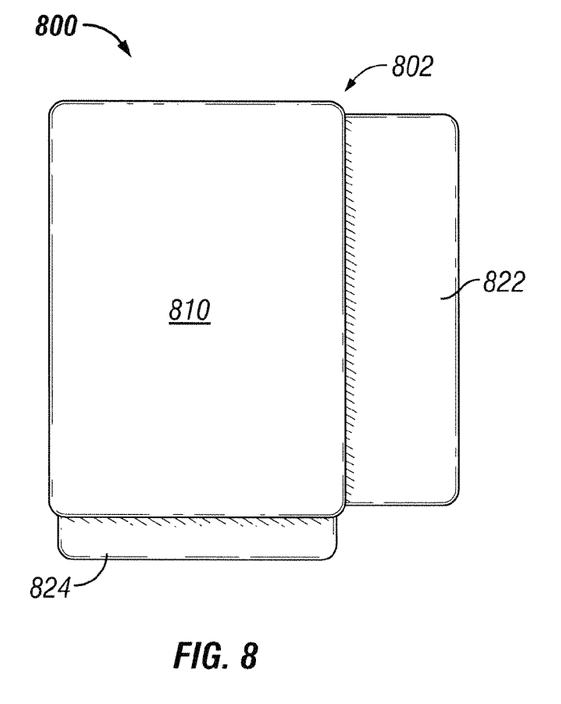
FIG. 8 shows yet another exemplary solar shield in accordance with certain exemplary embodiments.

FIG. 8 shows still another exemplary solar shield 800 in accordance with certain exemplary embodiments. Specifically, FIG. 8 shows the top or front surface 810 of the body 802 of the solar shield 800. In such an exemplary embodiment, one or more panels (e.g., panel 822, panel 824) can be extendably coupled to one or more portions of the body 802. In this example, a panel 822 is extendably coupled to one side of the body 802, while another panel 824 is extendably coupled to a bottom side of the body 802.

Each panel can be extendably coupled to the body 802 in one or more of a number of ways. For example, a panel can be slidably coupled to the body 802. As another example, a panel can be unrolled or unfolded from the body 802. Each band can be made of one or more of a number of rigid (e.g., wood, stainless steel) and/or non-rigid (e.g., elastic, nylon, cotton fabric) materials cover a top surface 430 of one or more PV solar panels 450. The body 802 of the solar shield 800 can include one or more of a number of fastening features (not shown) (e.g., pocket 622, securing band 722, clip) that are used to engage one or more components of the PV solar system 444. In addition, or in the alternative, one or more of the panels can include a fastening feature.

As the panels can be extendable from the body 802, the panels can also be retracted into the body 802. In such a case, as a panel is partially or fully retracted into the body 802, the portion top surface 430 of one or more PV solar panels 450 that are covered by the panel can be exposed to solar radiation.

Figure 9:
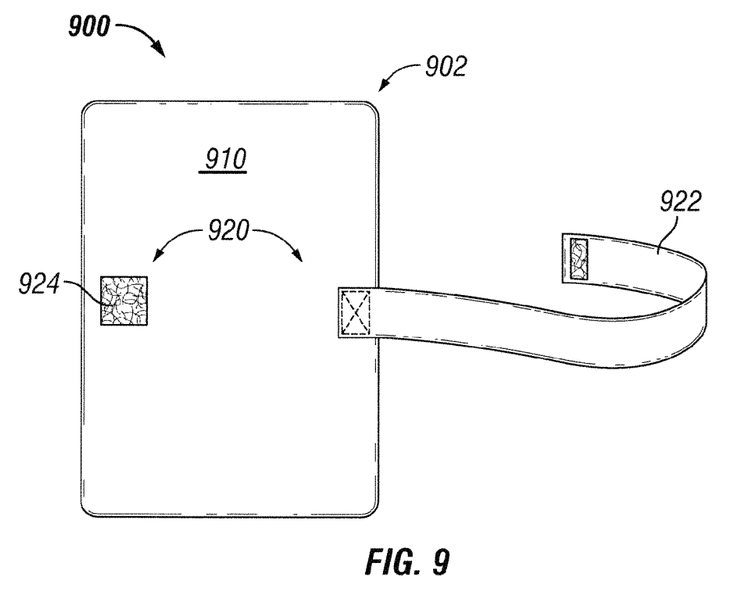
FIG. 9 shows still another exemplary solar shield in accordance with certain exemplary embodiments.

FIG. 9 shows yet another exemplary solar shield 900 in accordance with certain exemplary embodiments. Specifically, FIG. 9 shows the front or top surface 910 of the body 902 of the solar shield 900. In this example, the top surface 910 includes one or more securing features 920. In this example, the securing feature 920 is a strap 922 and a fastening feature 924. The strap 922 can be fixedly coupled (e.g., sewed, affixed with epoxy), in one or more locations (e.g., on the top surface 910, on a side) of the body 902. The strap 922 can have a length sufficient to wrap around (engages) one or more components of the PV solar system 444 and secure its end to the fastening feature 924.

The fastening feature 924 can be one or more of a number of fastening devices and/or features, including but not limited to Velcro, a clamp, a slot, and a snap. The fastening feature 924 can be disposed on the top surface 910 of the body 902 and/or at any other location on the body 902. A coupling feature (not shown) corresponding to the fastening feature 924 can be disposed on a portion (e.g., toward the end) of the strap 922 to allow the securing feature 920 to become engaged. In certain exemplary embodiments, the fastening feature 924 is disposed on a portion of the strap 922 that is different than the portion on which the coupling feature is disposed. A securing feature 920 can include more than one strap 922 and/or more than one fastening feature 924. In such a case, one strap can engage with (become mechanically coupled to) another strap to secure the solar shield 900 on top of the top surface 430 of one or more PV solar panels 450.

The strap 922 can be made of one or more of a number of flexible or non-rigid materials (e.g., elastic, nylon, cotton fabric) to wrap around one or more components of the PV solar system 444 so that the solar shield 900 covers the top surface 430 of one or more PV solar panels 450. To disengage the securing feature 920, the coupling feature of the strap 922 is decoupled from the fastening feature 924. In such a case, the solar shield 900 can be moved, exposing the top surface 430 of one or more PV solar panels 450 that are covered by the solar shield 900 to solar radiation.

Exemplary embodiments provide for a solar shield. Specifically, certain exemplary embodiments allow for covering a top surface 430 of one or more PV solar panels so that little or no solar radiation is received by solar cells within the PV solar panels. In such a case, exemplary solar shields prevent the PV solar panel from generating electricity when a securing feature of the solar shield is engaged with one or more portions of a PV solar system. Exemplary solar shields can be of any shape and/or have any dimensions.

In addition, exemplary embodiments provide for increased safety in maintaining PV solar panels because such PV solar panels are without a significant electrical charge (current, voltage) when the solar shield covers the top surface 430 of the PV solar panel. Exemplary embodiments can save time, material, and money in installing and maintaining one or more PV solar panels of a PV solar system. Specifically, using exemplary solar shields described herein reduces or eliminates the concern of electric shock to a user while performing maintenance and/or installation services on a PV solar system. In addition, the use of exemplary solar shields can provide one or more of a number of electrical benefits, including but are not limited to ease of engagement and/or disengagement of a securing feature, ease of maintenance, and increased safety.

Although embodiments described herein are made with reference to exemplary embodiments, it should be appreciated by those skilled in the art that various modifications are well within the scope and spirit of this disclosure. Those skilled in the art will appreciate that the exemplary embodiments described herein are not limited to any specifically discussed application and that the embodiments described herein are illustrative and not restrictive. From the description of the exemplary embodiments, equivalents of the elements shown therein will suggest themselves to those skilled in the art, and ways of constructing other embodiments using the present disclosure will suggest themselves to practitioners of the art. Therefore, the scope of the exemplary embodiments is not limited herein.

What is claimed is:

1. A solar shield, comprising:
    A solar shield body having a length and a width, wherein each of the length and the width is at least large enough to cover a top surface of at least one photovoltaic (PV) solar panel, wherein the solar shield body prevents substantially all solar radiation from passing therethrough, and wherein the solar shield body lacks components capable of generating PV power;
    at least one fastening feature disposed at a first end of the solar shield body, wherein the at least one fastening feature comprises:
        a base coupled to the first end of the solar shield body by a hinge;
        a fastening feature body that extends from the base;
        a shelf that protrudes outward from the fastening feature body and is configured to engage an edge of the at least one PV solar panel, wherein the shelf, when engaged with the edge of the at least one PV solar panel, secures the solar shield body over the top surface of the at least one PV solar panel; and
        a neck that extends from a distal end of the fastening feature body, wherein the neck is configured to receive a force applied from a user to rotate the at least one fastening feature about the hinge relative to the first end of the solar shield body, and
    at least one protrusion that extends substantially orthogonally from the solar shield body at a second end of the solar shield body, wherein the second end of the solar shield body is opposite the first end, wherein the at least one protrusion abuts against an opposing edge of the at least one PV solar panel when the shelf engages the edge of the at least one PV solar panel, wherein the opposing edge of the at least one PV solar panel is opposite the edge.

2. The solar shield of claim 1, wherein the solar shield body is rigid.

3. The solar shield of claim 1, wherein the shelf protrudes from an outer edge of at least one side of the solar shield body.

4. The solar shield of claim 1, wherein the solar shield body comprises a plurality of panels that are extendably coupled to each other and alter at least one selected from a group consisting of the length and the width.

5. The solar shield of claim 1, wherein the solar shield body is flexible.

6. The solar shield of claim 1, wherein the solar shield body comprises a graphic on a side of the solar shield body that faces away from the top surface of the at least one PV solar panel.

7. The solar shield of claim 1, wherein the solar shield body is opaque.

8. The solar shield of claim 1, wherein the at least one fastening feature further comprises an additional base, an additional fastening feature body, an additional shelf, and an additional neck, wherein the additional shelf is configured to engage the opposing edge of the at least one PV solar panel.

9. The solar shield of claim 1, wherein the at least one protrusion is planar.

10. The solar shield of claim 1, wherein the neck forms an obtuse angle with the fastening feature body.

11. A solar shield, comprising:
    a solar shield body having a length and a width, wherein each of the length and the width is at least large enough to cover a top surface of at least one photovoltaic (PV) solar panel, wherein the solar shield body prevents substantially all solar radiation from passing therethrough, and wherein the solar shield body lacks components capable of generating PV power;
    at least one fastening feature disposed at a first end of the solar shield body, wherein the at least one fastening feature comprises:
        a base coupled to the first end of the solar shield body;
        a fastening feature body that extends from the base, wherein the fastening feature body forms substantially a U shape from a side view, wherein the fastening feature body is configured to be disposed within a frame to which the at least one PV solar panel is mechanically coupled;
        a tab that protrudes outward from the fastening feature body and is configured to engage a first portion of the frame when the fastening feature body is disposed within the frame, wherein the tab, when engaged with the first portion of the frame, secures the solar shield body over the top surface of the at least one PV solar panel; and
        a neck that extends from a distal end of the fastening feature body, wherein the neck is configured to receive an inward force applied from a user to disengage the tab from the first portion of the frame; and
    at least one protrusion that extends substantially orthogonally from the solar shield body at a second end of the solar shield body, wherein the second end of the solar shield body is opposite the first end, wherein the at least one protrusion abuts against a second portion of the frame when the tab engages the first portion of the frame, wherein the first portion of the frame is opposite the second portion;
    wherein the U shape of the fastening feature body forms a gap of uniform width therebetween, wherein the gap allows the neck to be pinched inward toward the base to allow the tab to become disengaged from the first portion of the frame.

12. The solar shield of claim 11, wherein the at least one fastening feature further comprises an additional base, an additional fastening feature body, an additional tab, and an additional neck, wherein the additional tab is configured to engage the second portion of the frame, wherein the first portion of the frame is adjacent to a first edge of the at least one PV solar panel, wherein the second portion of the frame is adjacent to a second edge of the at least one PV solar panel.

13. The solar shield of claim 11, wherein the first portion of the frame comprises a U-shaped bracket, and wherein the fastening feature body of the at least one fastening feature is configured to be disposed within a channel of the U-shaped bracket when the tab engages the first portion of the frame.

14. The solar shield of claim 11, wherein the neck forms an obtuse angle with the distal end of the fastening feature body relative to where the tab protrudes from the fastening feature body.

15. A photovoltaic (PV) solar system comprising:
   a first PV solar panel comprising a top surface, a first edge, and a second edge, wherein the first edge is located at an opposite end of the top surface relative to the second edge;
   a mounting rack comprising a first bracket and a second bracket, wherein the first PV solar panel is coupled to the mounting rack and disposed between the first bracket and the second bracket; and
   a solar shield disposed over the top surface of the first PV solar panel, wherein the solar shield comprises:
      a solar shield body having a length and a width, wherein each of the length and the width is at least large enough to cover the top surface of the first PV solar panel, wherein the solar shield body prevents substantially all solar radiation from passing therethrough, and wherein the solar shield body lacks components capable of generating PV power;
      at least one fastening feature disposed at a first end of the solar shield body, wherein the at least one fastening feature comprises:
         a base coupled to the first end of the solar shield body by a hinge;
         a fastening feature body that extends from the base;
         a shelf that protrudes outward from the fastening feature body and engages the first bracket of the mounting rack, wherein the shelf, when engaged with the first bracket, secures the solar shield body over the top surface of the first PV solar panel; and
         a neck that extends from a distal end of the fastening feature body, wherein the neck is configured to receive a force applied from a user to rotate the at least one fastening feature about the hinge relative to the first end of the solar shield body, and
      at least one protrusion that extends substantially orthogonally from the solar shield body at a second end of the solar shield body, wherein the second end of the solar shield body is opposite the first end, wherein the at least one protrusion abuts against the second bracket of the mounting rack when the shelf engages the first bracket of the mounting rack.

16. The PV solar system of claim 15, wherein the first bracket of the mounting rack is a bracket, and wherein the fastening feature body of the at least one fastening feature is configured to abut against a back surface of the bracket when the shelf engages a bottom surface of the first bracket, wherein the back surface and the bottom surface of the first bracket are adjacent to each other.

17. The PV solar system of claim 15, further comprising:
   a second PV solar panel coupled to the mounting rack adjacent to the first PV solar panel, wherein the second PV solar panel is disposed between the first bracket and the second bracket, wherein the second PV solar panel comprises an additional top surface,
   wherein the body of the solar shield covers the additional top surface of the second PV solar panel when the shelf of the at least one fastening feature engages the first bracket.

* * * * *